United States Patent [19]
Porter

[11] 3,951,389
[45] Apr. 20, 1976

[54] ELASTOMER PROCESSING METHOD

[75] Inventor: John P. Porter, Cuyahoga Falls, Ohio

[73] Assignee: The B. F. Goodrich Company, Akron, Ohio

[22] Filed: Dec. 16, 1974

[21] Appl. No.: 532,937

Related U.S. Application Data

[63] Continuation of Ser. No. 307,583, Nov. 17, 1972, abandoned.

[52] U.S. Cl. .............................. 259/192; 235/151.1; 259/9; 259/185; 259/DIG. 2; 259/DIG. 19
[51] Int. Cl.² .......................... B29B 1/04; B29H 1/10
[58] Field of Search ............... 259/185–195, DIG. 2, DIG. 19, 9, 10; 324/142, 111, 132; 235/151.1

[56] References Cited
UNITED STATES PATENTS

| | | | |
|---|---|---|---|
| 2,595,373 | 5/1952 | Stewart | 324/142 X |
| 2,994,100 | 8/1961 | Comes | 259/DIG. 2 |
| 3,237,241 | 3/1966 | Gagliardi | 259/192 |
| 3,375,717 | 4/1968 | Impellizzeri | 324/142 X |
| 3,447,201 | 6/1969 | Seanor | 259/191 |
| 3,456,599 | 7/1969 | Baker | 259/191 |

*Primary Examiner*—Billy J. Wilhite
*Assistant Examiner*—James A. Niegowski

[57] ABSTRACT

A method for indicating the time integral of the electrical power consumed in elastomer mixing, working, warming or other processing and for controlling the processing in accordance therewith. An electrical signal, derived from the electrical power consumed by an electrical motor driven elastomer processing apparatus, is compensated for no-load operation of the apparatus and then continuously integrated with respect to time to provide an output which is employed to produce a digital readout of the energy consumed in the processing with control of the processing being effected in accordance therewith.

6 Claims, 3 Drawing Figures

ELASTOMER PROCESSING METHOD

CROSS-REFERENCE TO RELATED APPLICATIONS

This application is a continuation of copending application Ser. No. 307,583, filed Nov. 17, 1972, and now abandoned.

BACKGROUND OF THE INVENTION

The preparation of uncured elastomer for use in manufacturing tires, hose, belts and other articles of reinforced or unreinforced elastomer requires that the elastomer have various substances incorporated therein to provide desired properties both during processing and in the final product. This is customarily effected by adding the various ingredients to the elastomer as it is mechanically worked. Due to the nature of some of the ingredients, and/or the effect they have on the composition, all the ingredients generally cannot be added at the same time. Consequently, it is customary to subject the elastomer to mechanical working, as by means of a Banbury mixer or other mixing apparatus, with the several ingredients added at various times during that mixing. The time of addition of the ingredients is determined, in some instances, by the temperature of the mix and/or by the length of time the materials in the mixer have been subjected to working. There also have been attempts to determine the proper times to add ingredients by the amount of power that has been consumed by the mixing apparatus. Unfortunately, however, none of the systems customarily employed have been entirely satisfactory.

The use of temperature as the criterion of the amount of working before adding ingredients is inexact due in large measure to the difficulty of accurately measuring the temperature of the mixture during the operation. Likewise, the addition of ingredients in accordance with the length of time mixing has occurred has not proved satisfactory since various elastomers respond differently to mixing and small differences in timing can be significant. Furthermore, in some instances, the addition of one ingredient may alter the length of time of mixing that should be required before the addition of another ingredient. Hence, it is practically impossible to develop a meaningful time control for the addition of ingredients.

The efforts to regulate the addition of compounding ingredients to elastomers by the amount of power consumed by the mixing apparatus has heretofore proved unsatisfactory since available meters have not been sufficiently accurate for the time periods which are of interest in such operations. Also such instruments are not resettable or readily controlled for starting and stopping when a batch is introduced into or removed from the mixing apparatus. Moreover, there has been no readily available means to eliminate from the readings of conventional instruments the power consumed by the apparatus in frictional and other losses.

The inability to accurately determine the proper intervals at which compounding ingredients should be added to elastomer has resulted in substantial variations in the nature of separately mixed batches with corresponding lack of uniformity and predictability of characteristics of products made therefrom. Similar difficulties are encountered in attempting to secure uniformity of other elastomer processing operations such as conventional warm-up or other conditioning operations preparatory to employing the elastomer in extruding, calendering and similar operations.

SUMMARY OF THE INVENTION

In accordance with this invention the aforementioned difficulties are overcome and more accurate control of processing of uncured elastomer is effected with correspondingly more uniformity in the resulting compositions, by measuring the time integral of electrical power consumed in working the elastomer. More precisely, the invention resides in a method for controlling elastomer conditioning by effecting it in an electrically driven apparatus and controlling the operation thereof in accordance with the amount of work expended upon the elastomer. As applied to elastomer compound mixing, the addition of materials to the elastomer being mixed is controlled in accordance with the consumption of preselected amounts of electrical power to effect the mixing, the indication of the electrical power consumed being conpensated for the no-load operation of the apparatus so that the indication of the power consumed, and the control of the operation thereof, is in accordance with the actual power utilized in the mixing and does not include that which is lost in friction and other losses resulting from the operation of the mixing apparatus when the elastomer is not present therein.

Still more specifically, the invention resides in the method and apparatus as just defined wherein an electrical signal is provided, indicative of the electrical power consumed by the motor for the mixer, with a provision to compensate the signal for the no-load operation of the mixer, which signal is then integrated with respect to time and employed to provide a digital read-out of the energy consumed in the mixing operation, the addition of materials to the mixer and the completion of the mixing cycle being sequentially effected when predetermined amounts of energy has been so consumed.

BRIEF DESCRIPTION OF THE DRAWINGS

The presently preferred embodiment of the invention is illustrated in the accompanying drawings, forming a part of this application, in which.

DESCRIPTION OF THE PREFERRED EMBODIMENT

The method and apparatus of this invention are herein illustrated and will be specifically described as applied to a conventional elastomer mixing or compounding apparatus of the type known as a Banbury mixer. Such mixers are well-known in the prior art and, hence, only so much thereof as is necessary to an understanding of the invention will be hereinafter specifically illustrated and described.

Figure 1:
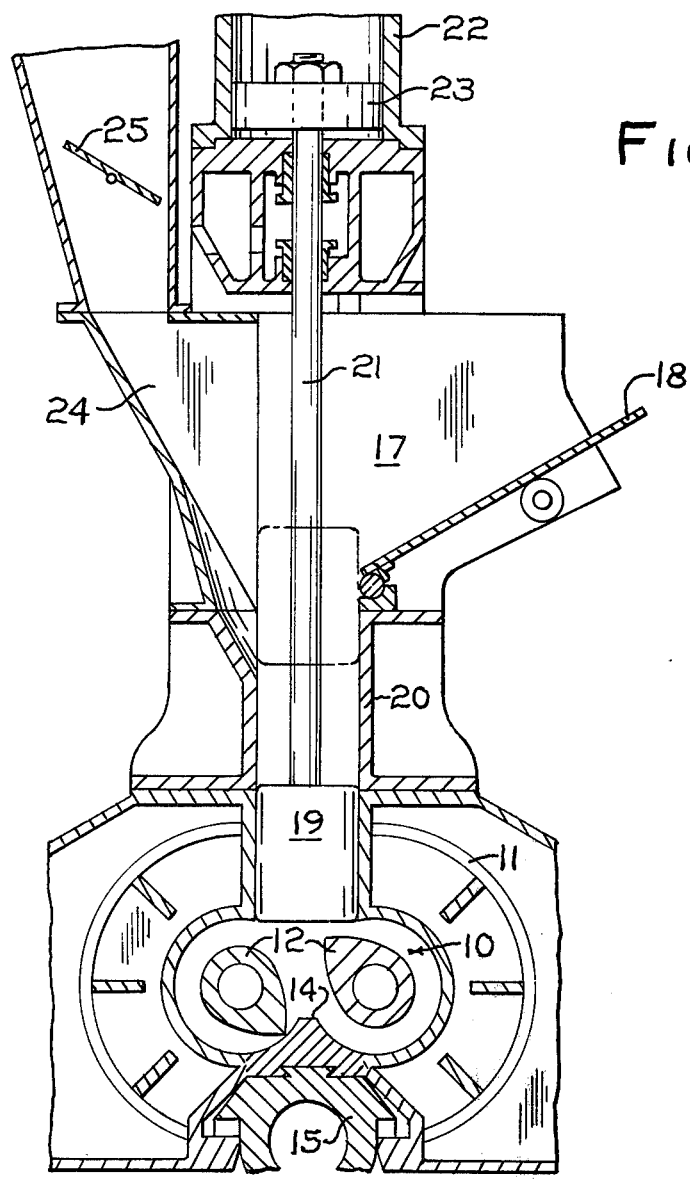
FIG. 1 is a fragmentary, sectional view taken vertically through an electrically driven elastomer mixing apparatus.
Figure 3:
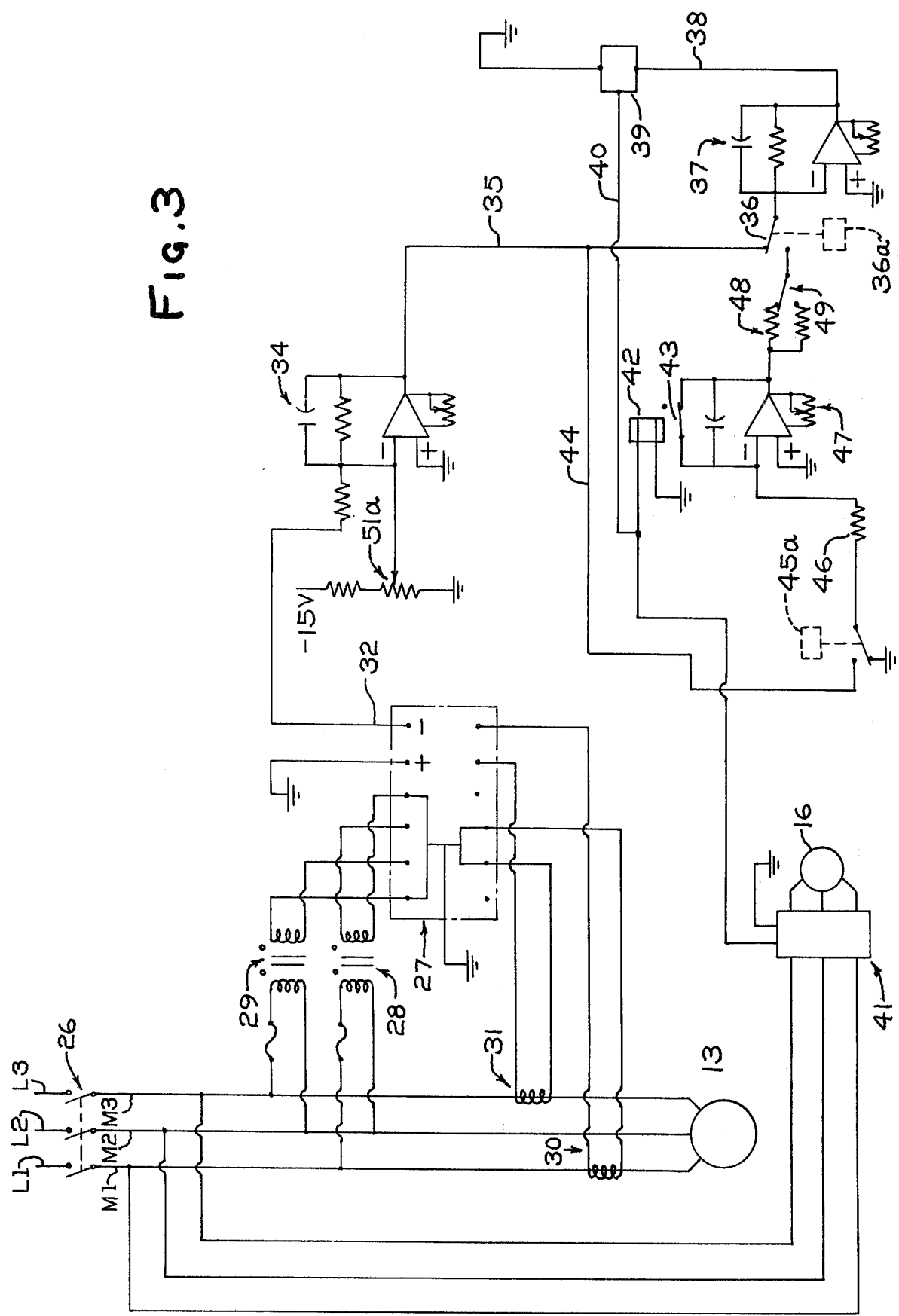
FIG. 3 is a schematic electrical diagram of the electrical circuit of the apparatus.

Referring first to FIG. 1 of the drawings, the mixing apparatus shown comprises a mixing chamber 10 which is surrounded by a heating jacket 11 to permit the circulation of water or other fluid for controlling the temperature of the materials being mixed in the chamber 10. Within the chamber 10 are a pair of rotors 12 which are revolved in opposite directions by an electrical motor not shown in FIG. 1 but which is indicated at 13 in FIG. 3. The lower portion of the mixing chamber 10 is provided with a ridge 14 which forms a part of the closure member 15 for the bottom of the mixing chamber. The closure member may be slid, perpendicularly to the plane of the drawing, to open the lower portion of the mixing chamber and thus effect discharge of material contained therein. The ridge 14, when the closure member is in the position shown in FIG. 1, cooperates with the rotors 12 to assist in the mixing operation. The ridge 14 and the member 15 on which it is mounted are movable between open and closed positions under control of an electrical motor 16, not shown in FIG. 1 but which is indicated in FIG. 3.

The materials to be mixed are introduced into the chamber 10 through a load opening 17 which has a movable wall 18 disposed in the position shown in full lines in FIG. 1 for introduction of materials and movable to a vertical, closed position, after the introduction of materials has been completed. The apparatus also incorporates a pressure ram 19, or floating weight, for imposing pressure upon the material in the mixing chamber. This ram is mounted in a stack or guideway 20 communicating with and extending upwardly from the upper portion of the mixing chamber 10. The ram 19 is moved vertically by a piston rod 21 which extends into a cylinder 22 and is connected therein to a piston 23. The cylinder 22 is provided with the usual ports for introduction and exhaust of fluid pressure to effect movement of the ram or weight 19 from the full line position shown in FIG. 1 to an elevated position to thereby provide space therebeneath for the introduction of materials through the opening 17. The apparatus is also shown as provided with gas and dust exhaust passage 24 provided with a suitable valve 25.

It will be readily understood by those skilled in the art that the mixing or compounding of an uncured elastomer is effected in the apparatus as shown in FIG. 1 by elevating the weight or ram 19 to the upper position and disposing the movable wall 18 of the load opening 17 in the position shown in FIG. 1. The elastomer is then introduced through the opening 17 into the mixing chamber where it is subjected to mechanical working by the rotors 12 as these are driven by motor 13. The material is confined in the mixing chamber by the ram or weight 19 disposed in its lower position as shown.

After the elastomer has been worked to an appropriate extent the other ingredients are added at intervals by sequentially moving the ram or weight 19 to its upper position and disposing the wall 18 in a location such that the ingredients may be introduced through opening 17. This opening may then be closed and the ram lowered for effecting mixing of the added ingredients into the elastomer. The addition of materials is generally effected while the rotors 12 remain in operation and it is frequently desirable to effect the initial mixing of an added ingredient or ingredients to the elastomer for a short interval of time before the weight or ram 19 is moved from its upper to lower position for completion of that portion of the mixing; this operation being known as a "roll" of the materials in the mixing chamber.

Upon completion of the desired mixing cycle the closure member 15, which covers the discharge opening, is moved by the motor 16 to open position while the mixing motor 13 of the apparatus continues the rotation of the rotors 12 so that the material is discharged from the chamber 10 and the walls thereof purged of the mixed material. After discharge is completed the discharge opening is closed and a new cycle is initiated.

In accordance with this invention, the control of the compounding or mixing of the elastomer is effected pursuant to the amount of electrical power which is consumed in the mixing operation. This is effected by deriving an electrical signal from the electrical power employed to operate the motor 13, compensating that signal for the no-load operation of the apparatus, integrating the electrical signal with respect to time, and employing the integrated signal to actuate a digital indicator so that a reading is provided of the time integral of the electrical power consumed in mixing the elastomer. The indicating device preferably also includes a means which permits mixer discharge to be automatically performed when the time integral of the electrical power consumed reaches a predetermined value.

Referring now to FIG. 3 of the drawings, it will be seen that electrical power is supplied to the motor 13, for the operation of the rotors 12, from a suitable source of three phase, alternating electrical energy, through the power supply lines L1, L2 and L3, which are connectible with motor leads M1, M2 and M3 through a suitable disconnected switch 26. A watts transducer 27 is operatively connected to the motor supply leads M1, M2 and M3 to derive a signal representative of the power comsumed by motor 13. The watts transducer 27 may be of conventional type as, for example, that sold under the trade name Halltiplier by Esterline Scientific Columbus, a division of the Esterline Corporation, of Columbus, Ohio.

The transducer 27 is connected to the motor leads M1, M2 and M3 by voltage transformers 28 and 29, and current transformers 30, 31. Thus, the primaries of transformers 28 and 29 are connected, respectively, between the motor leads M1, M2 and M3, M4, while the current transformers 30 and 31 are inductively associate with the motor leads M1 and M3, respectively. The secondaries of the transformers 28, 29 and 30, 31 are connected to the transducer terminals, as shown in FIG. 3, so that the latter produces an output signal through line 32 which is indicative of the electrical power consumed by the motor 13. Typically, the current flow through the line 32 will be at a maximum of 100 millivolts, which, after amplification as hereinafter described, is equivalent to 100 kilowatts of power consumed by the motor 13 so that each millivolt output of the transducer becomes equivalent to one kilowatt of power consumed by the motor.

Figure 2:
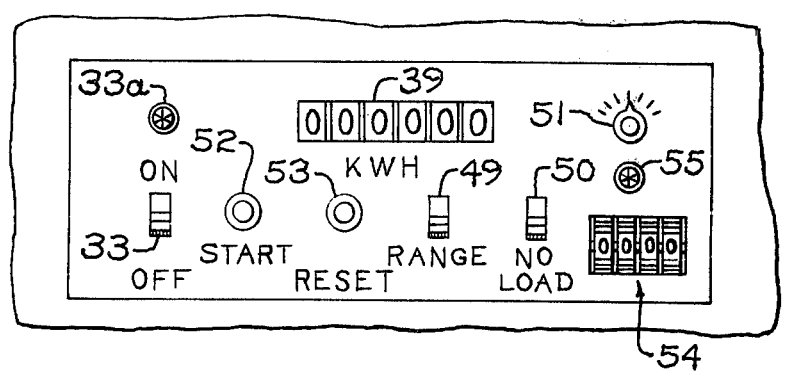
FIG. 2 is a front elevational view of the control panel for the electrical circuit which provides the digital read-out of the energy consumed by the apparatus of FIG. 1.

The amplification, integration and utilization of the electrical output signal from transducer 27 is effected through an electronic circuit, as hereinafter described, the power for which is derived from a conventional power supply, not shown, controlled by switch 33 on the instrument control panel, see FIG. 2. A lamp 33a is provided on that panel to indicate when the switch 33, and hence, the power supply for the indicating and control circuit, is in the "on" condition.

The electrical signal from the transducer 27 passes through the line 32 to a buffer amplifier 34 from which the signal then travels through line 35 to a switch contact 36 and thence to an amplifier 37. The output of the amplifier 37 passes through line 38 to a digital voltmeter 39. The voltmeter 39 is of a commercially available type which, for example, may be one of the Series 270 sold by Newport Laboratories, Inc., of Santa Ana, Calif. This device not only provides a digital readout of the signal supplied to it but also includes a settable contact which can be made to operate when a predetermined reading is reached. This settable contact, in accordance with this invention, is connected with a line 40 extending to a motor relay 41, which controls the operation of the motor 16 that in turn operates the closure member 15 for the discharge of the mixer. In addition, the line 40 is connected to a relay 42 which controls reset contact 43.

The line 35 is connected by a line 44 to a switch contact 45 that, when operated, closes the circuit through resistance 46 to an integrating amplifier 47 about which the aforementioned switch 43 is bridged. From the amplifier 47 the signal, which has now been integrated with respect to time, passes through one or the other of two range selecting resistors 48 and through a switch contact 49 to the aforementioned switch contact 36. From the switch contact 36, when the latter is moved from the position shown in FIG. 3 to its second circuit closing position, the integrated signal passes through the previously described amplifier 37 and 38 to the digital voltmeter 39 which, as previously mentioned, is also connected with the relay 42 and the motor control relay 41.

The integrating amplifier 47 is adjusted to a time constant of appropriate amount for the specific application. In the operation herein specifically described the time constant is 3.6 seconds. Hence, since there is one millivolt of signal strength for each kilowatt of power consumed by the motor 13, the integrated signal provided to the digital voltmeter is equivalent to the kilowatt hours of energy consumed by the mixer motor.

The circuit just described is such that operation of the mixer is initiated by closing the disconnect switch 26 thereby energizing the motor 13 through the motor leads M1, M2 and M3. Simultaneously, power flows to the motor control relay 41 which at this time prevents flow of power to the motor 16 so that the closure member 15 of the mixer is maintained in closed position. The operator also actuates the switch 33 to the "on" position, which renders the electronic circuit operational, and operates the no-load switch 50, see FIG. 2 to "on" position. Closing of switch 26 results in the flow of electrical power to the motor 13 causing a signal to flow from the watts transducer 27 through the line 32 to and through the amplifier 34. Operation of switch 50 operates a relay 36a which closes the contact 36 connecting the output from amplifier 34 to amplifier 37 and from there to voltmeter 39 which provides a digital reading indicative of the energy in kilowatt hours consumed by the mixer motor when the mixer is operating empty or under a no-load condition. The operator then turns knob 51 to set a potentiometer 51a, connected with the input of the amplifier 34, to thereby compensate the signal coming from the watts transducer 27 so that the voltmeter 39 indicates a zero reading for the no-load or empty operation of the mixer.

The operator now sets the switch 50 to the "off" position and actuates the start button 52. He then introduces the elastomer into the mixer, the ram or weight 19 of the latter being in the elevated position. The operation of switch 50 acts through relay 36a to move the contact 36 from the position shown in FIG. 3 to circuit closing relationship with the resistances 48 while actuation of the start button 52 energizes relay 45a which moves contact 45 to circuit closing position. At this time the contact 43 is held open by the relay 42 and, hence, the signal coming from the watts transducer 27 is not integrated with respect to time and the digital reading thereof appears upon the dials of the voltmeter 39. The switch 49 permits a change of range for the voltmeter, if desired, as, for example, when employing the apparatus for very short mixing cycles.

During the mixing cycle the operator will, from time to time, add ingredients to the elastomer. The proper intervals for these additions can be precisely determined in accordance with the amount of energy expended in mixing the elastomer through observation of the readings upon the voltmeter. When such additions are made, the ram or weight 19 is elevated and, subsequent to an addition, the mixer may continue to operate with the ram elevated for a time after which the ram is again lowered to the position shown in FIG. 1 for additional mixing action.

When all of the ingredients have been added and the mixing has been completed, as determined by the reading of the voltmeter, the operator may manually terminate the mixing cycle by pressing the reset button 53. This not only resets the digital voltmeter reading to zero but also causes relay 42 to move the contact 43 to the position shown in FIG. 3 terminating integration of the signal from the watts transducer 27. Also, power is now supplied to the motor controller 41 thus operating motor 16 to move closure member 15 to the material discharging position. A new cycle may be resumed by again pressing the start button 52 and adding elastomer and ingredients as above described.

As aforementioned, the voltmeter 39 includes a contact which can be set for closing upon a predetermined reading of the voltmeter. This setting may be effected by adjustment of thumb-wheel switches 54, FIG. 2. When this feature is employed it is unnecessary for the operator to actuate the reset button 53 in order to discharge the material and reset the voltmeter since this will automatically occur when the predetermined reading is obtained on the meter. The closing of this contact and discharge of the material is indicated by the lighting of lamp 55, see FIG. 2.

The determination of the amount of mixing or working of the elastomer which should occur prior to and/or after the introduction of each of the ingredients, and the total length of mixing cycle is established by experimentation. This is effected by carefully observing the properties of compounded elastomers in which the various ingredients have been incorporated at selected intervals measured by predetermined consumptions of electrical energy. Having established the proper amount of energy required for mixing a batch of material with desired properties, subsequent batches of like size and composition of very uniform characteristics can be obtained by careful observation of the voltmeter reading during the mixing cycle and adding the ingredients upon the consumption of the requisite energy as indicated by the meter 39.

The following example illustrates the way in which the method of this invention was employed to effect mixing of a 200 pound batch of elastomer, it being understood that the invention is not limited to the number of steps, the nature thereof or their sequence of operations as set forth herein. In this example, the second column provides the kilowatt hour readings on the meter 39 when the operation, indicated in the last column, is performed. The third column provides the energy requirements per pound for the operations performed for the composition of the example so that batches of like composition but of weight different than 200 pounds can be prepared.

| Step | KWH | Watt hrs./lb. | Operations |
| --- | --- | --- | --- |
| 1 | 0.00 | 0.00 | add polymers |
| 2 | 0.50 | 2.50 | add carbon black |
| 3 | 3.60 | 18.00 | roll |
| 4 | 4.00 | 20.00 | add oil |
| 5 | 5.60 | 28.00 | roll |
| 6 | 6.00 | 30.00 | add curatives |
| 7 | 9.00 | 45.00 | dump and reset |

Although the invention has been described with specific reference to its application in a rubber mixing process employing an apparatus known as a Banbury mixer, it will be apparent that the principles of the invention may be employed with other elastomeric materials, including plastics, as well as with rubber, and with mixing or processing equipment, other than a Banbury, wherein an electrical motor drive is employed for effecting mechanical working of the elastomeric material. Moreover, the invention may be utilized with a two motor mixer by utilizing two similar circuits from a separate transducer for each motor operating into the integrating amplifier 47 with the separate inputs switched by the high-low motor control switch normally provided for such two motor installations. It will also be evident that, although automatic control of only the discharge of the batch has been illustrated, it is readily possible to adapt the invention to automatic control of other operations, as for example, the charging of the material and/or operation of ram 19, through suitable relays and electrically operated valves, as will be readily understood by those skilled in the art.

Finally, although the invention has been specifically described as it is practiced for single batch mixing, continuous batch mixing may be effected without need for repeated operation of the start and reset buttons 52, 53, respectively, by having the mixer door provided with a switch to start the operation when the door is closed and reset the integrator when the door is automatically opened at the completion of the mixing cycle as determined by the consumption of the preselected amount of electrical energy. The above, and other adaptations of the invention that will readily occur to those skilled in the art, are all considered as included within the ambit of the invention which is limited only as required by the spirit and scope of the appended claims.

I claim:
1. The method of controlling elastomer processing comprising:
   a. placing the elastomer in an electrically driven apparatus capable of mechanically working the elastomer;
   b. providing an electrical signal representative of the electrical power required to operate said apparatus with the elastomer therein;
   c. compensating said signal for the amount of electrical power required to operate said apparatus without elastomer therein;
   d. integrating said compensated signal with respect to time;
   e. providing a continuous indication of said integrated signal; and,
   f. terminating the working of said elastomer upon the consumption of a preselected amount of electrical energy in working the elastomer as determined by said integrated signal.
2. The method as defined in claim 1 wherein said continuous indication is digital.
3. The method of controlling elastomer compound mixing comprising:
   a. placing the uncompounded elastomer in an electrically driven apparatus capable of mechanically mixing the elastomer;
   b. providing an electrical signal representative of the electrical power required to operate said apparatus with the elastomer therein;
   c. compensating said signal for the amount of electrical power required to operate said apparatus without elastomer therein;
   d. integrating said compensated signal with respect to time;
   e. adding at least one compounding ingredient to said elastomer upon the consumption of a preselected amount of electrical energy in mixing the elastomer as determined by said integrated signal; and,
   f. continuing the mixing of said elastomer after addition of an ingredient until consumption of a further preselected amount of electrical energy has occurred as determined by said integrated signal.
4. The method as defined in claim 3 wherein a digital indication is provided of said integrated signal.
5. The method as defined in claim 3 wherein the mixed elastomer compound is discharged from the apparatus when a preselected amount of electrical energy has been consumed in effecting the mixing.
6. The method as defined in claim 5 wherein the said discharge is automatically effected upon the consumption of said preselected amount of electrical energy.

* * * * *